United States Patent [19]
Steffes et al.

[11] Patent Number: 5,398,156
[45] Date of Patent: Mar. 14, 1995

[54] SHIELDED COMPUTER PRINTED CIRCUIT BOARD RETENTION APPARATUS

[75] Inventors: Karl M. Steffes; Jerry D. Gandre, both of Austin, Tex.

[73] Assignee: Dell USA, L.P., Austin, Tex.

[21] Appl. No.: 34,057

[22] Filed: Mar. 22, 1993

[51] Int. Cl.⁶ .......................... H05K 7/04; H05K 9/00
[52] U.S. Cl. .................................... 361/683; 361/753; 361/759; 361/818; 439/92; 439/931; 29/831
[58] Field of Search .................... 439/59, 92, 325, 327, 439/328, 345, 347, 629, 931; 361/679, 683–686, 724–727, 740–742, 746, 747, 753, 754, 756, 759, 798–802, 816, 818, 825–827; 174/138 D, 138 G; 29/467, 830–832

[56] References Cited

U.S. PATENT DOCUMENTS

| | | | |
|---|---|---|---|
| 4,158,450 | 6/1979 | Suzuki | 174/138 D X |
| 4,473,204 | 9/1984 | Böhm | 174/138 D X |
| 4,736,270 | 4/1988 | Porter | 174/138 D X |
| 4,982,847 | 1/1991 | Glover et al. | 361/802 X |
| 5,138,529 | 8/1992 | Colton et al. | 361/816 |
| 5,184,961 | 2/1993 | Ramirez et al. | 439/328 X |

*Primary Examiner*—Michael W. Phillips
*Attorney, Agent, or Firm*—J. Richard Konneker; James Huffman

[57] ABSTRACT

A printed circuit board is mounted on the inner side of a conductively coated plastic computer housing wall using a screwless retention and grounding system molded integrally with the housing wall and including a spaced series of upstanding hook plate portions extendable through a series of elongated slots in the circuit board body and positioned in spaced, facing relationships with corresponding contact tab portions. The board is releasably mounted by pressing it inwardly against the tabs in a manner causing the hook plates to extend through the board slots, and causing the board to depress a resilient latch member formed on the housing wall. The board is then slid along the tabs until the latch pops up and releasably locks the board to the contact tabs with the outer ends of the hook plates overlying the board. Small radiused outer ends of the hook plates bear against the board, along concentrated force areas, and function to press electrically conductive pads on the underside of the board against outer ends of the contact tabs. In molding the facing pairs of hook plates and contact tabs, small openings are formed therebetween in the housing wall. Pairs of opposing ribs on the housing wall form with the hook plate and contact tab pairs tunnels disposed around the housing wall openings and serving to substantially inhibit circuit board EMI/RFI emissions outwardly through the openings so that they need not be plugged or otherwise covered.

8 Claims, 2 Drawing Sheets

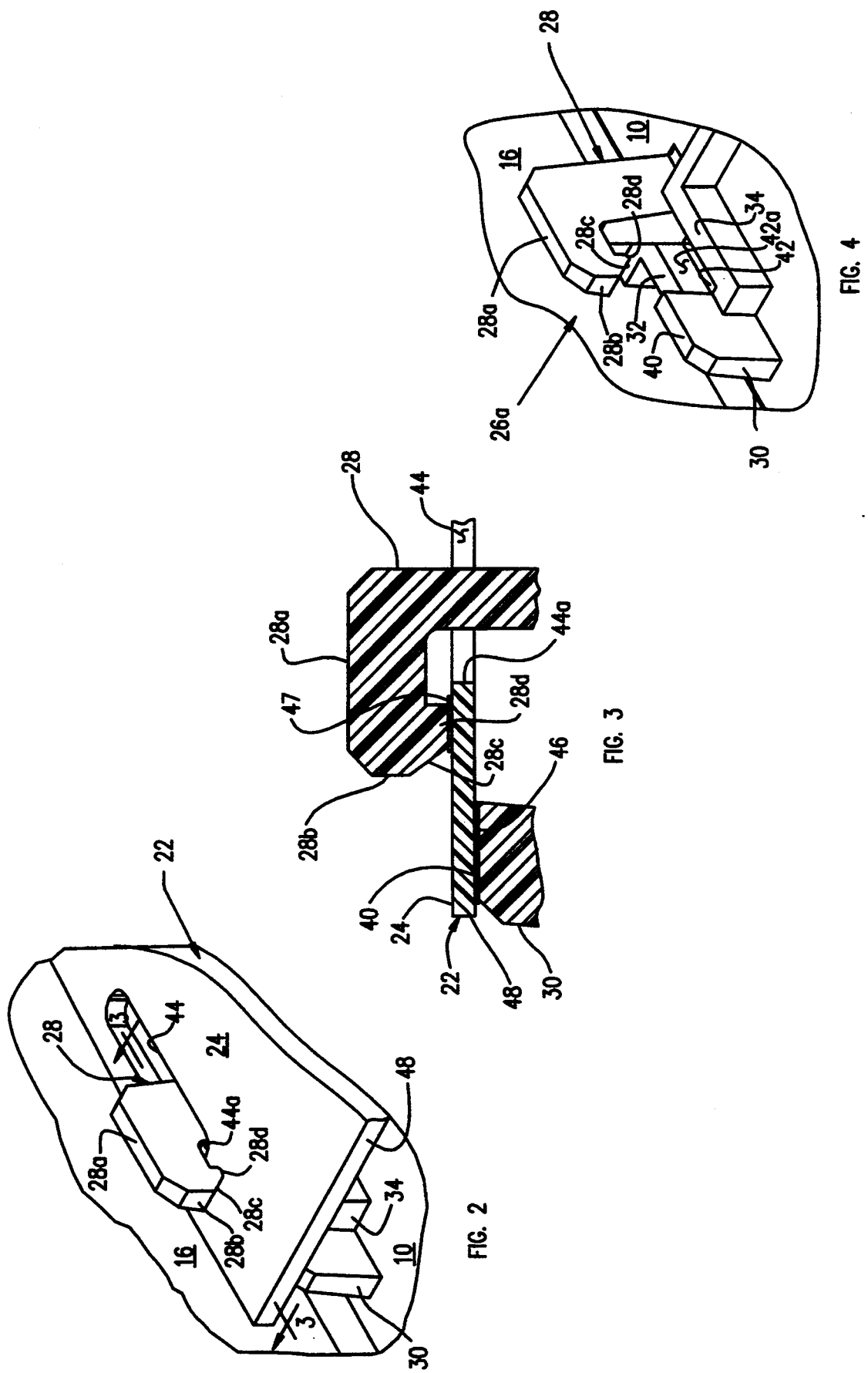

SHIELDED COMPUTER PRINTED CIRCUIT BOARD RETENTION APPARATUS

BACKGROUND OF THE INVENTION

The present invention relates generally to computer apparatus, and more particularly relates to apparatus for operatively mounting a printed circuit board within a computer housing.

The operative mounting of a printed circuit board within a computer housing, and the EMI/RFI grounding of the installed board within the housing, is conventionally achieved by removably securing the board to a wall portion of the housing using a series of screws extended through the board into thickened boss portions of the housing wall. The housing wall to which the circuit board is removably secured is typically coated with an electrically conductive material which functions as an extension of the circuit board ground plane to thereby shield the circuit board and inhibit the emission of EMI/RFI radiation from the circuit board outwardly through the computer housing.

While the use of screws to removably mount the circuit board on and ground it to the coated housing wall portion is a simple and rather straightforward method of mounting and grounding the circuit board, it also has the undesirable characteristics of being a rather time-consuming, labor intensive task (both in mounting and later removing the circuit board), and presenting the opportunity of dropping one or more or the mounting screws into inaccessible interior regions of the computer. Because of this, it would be desirable to provide improved apparatus for operatively securing and grounding a printed circuit board on the interior side of a computer housing without the above-mentioned problems associated with the conventional use of mounting screws. It is accordingly an object of the present invention to provide such improved apparatus.

SUMMARY OF THE INVENTION

In carrying out principles of the present invention, in accordance with a preferred embodiment thereof, apparatus is provided for removably securing a printed circuit board to a computer housing wall without the conventional use of a series of mounting screws to effect the circuit board mounting. The apparatus includes a spaced series of openings formed through the circuit board, and a spaced series of retention structures formed on a side of the housing wall and operative to removably hold the circuit board thereon in a parallel relationship therewith.

Each of the retention structures includes first projecting means against which a side of the circuit board may be placed when it is laterally moved toward the housing wall side to a first parallel position relative thereto, and second projecting means extendable through one of the circuit board openings in response to lateral movement of the circuit board to its first position.

The first and second projecting means function to cooperatively and releasably bear against spaced opposite side surface portions of the circuit board, in response to edgewise movement of the circuit board from its first position to a second position thereof, in a manner releasably holding the circuit board in its second position.

Latch means are preferably formed on the housing wall and are operative, in response to movement of the circuit board from its first position to its second position, to releasably block edgewise movement of the circuit board from its second position to its first position. In preferred embodiments thereof the housing wall is of a plastic material and the latch means and retention structures are molded integrally with the housing wall.

According to a further feature of the invention, the apparatus further comprises cooperating means on the retention structures and the circuit board for facilitating an EMI/RFI grounding connection between the circuit board and the housing wall when the circuit board is in its second position. Representatively, these cooperating means include an electrically conductive coating on the housing wall and the retention structures, and a spaced series of electrically conductive pad members disposed on a side of the circuit board and positioned to be engaged by the first projecting means when the circuit is in its second position.

In the molding of the retention structures, small housing wall openings are formed between the first and second projecting means of the retention structures. EMI/RFI radiation emission from the circuit board outwardly through these wall openings is preferably inhibited by forming upstanding ribs on the housing wall, the ribs being positioned and configured to form with the first and second projecting means tunneled extensions of the housing wall openings. The relative configurations of the first and second projecting means, together with these housing wall openings, permit the retention structures to be fabricated without the use of complex plastic tooling such as slides and lifters.

According to another aspect of the invention, the second projecting means contact side surface portions of the circuit board in a concentrated, point loading manner when the circuit board is in its second position. Preferably, the second projecting means are provided with relatively small, radiused contact portions that engage the circuit board to provide this point loading contact characteristic.

The apparatus of the present invention advantageously provides a screwless method of removably mounting a printed circuit board on the inner side of a computer housing wall. Using such method the circuit board is laterally moved toward the side of the housing wall to engage one side of the circuit board with the first projecting means while causing the second projecting means to pass through the circuit board openings. From this first position the circuit board is moved edgewise to its second position in which the circuit board is frictionally and releasably gripped, on its opposite sides, between the first and second projecting means portions of the retention structures.

When the circuit board is moved to its first position it engages and depresses the latch means. Upon subsequent edgewise movement of the circuit board to its second position the circuit board releases the latch means which move back to their original position in which they block edgewise movement of the circuit board back to its first position, thereby releasably locking the circuit board on the retention structures. To rapidly remove the circuit board the latch means are depressed, the circuit board is moved edgewise from its second position to its first position and is then simply lifted off the retention structures, with the second projecting means passing through the circuit board openings into which they were originally inserted.

BRIEF DESCRIPTION OF THE DRAWINGS

FIG. 2 is an enlarged scale perspective view of the circled area "2" of the circuit board and retention apparatus shown in FIG. 1;

FIG. 3 is a partial cross-sectional view taken through the circuit board and retention apparatus along line 3—3 of FIG. 2; and FIG. 4 is a perspective view of the retention apparatus portion shown in FIG. 2 with the circuit board removed therefrom.

DETAILED DESCRIPTION

Figure 1:
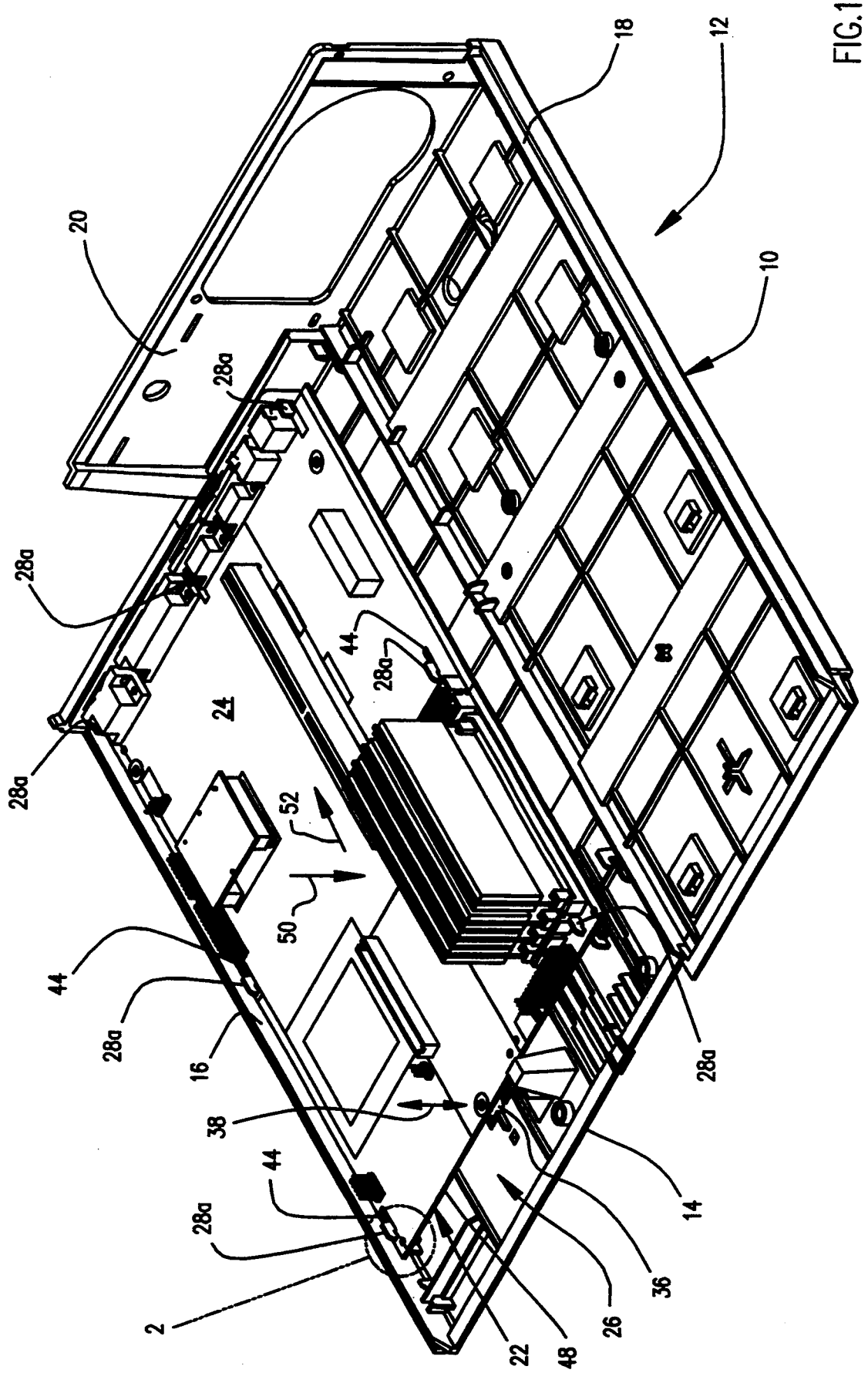
FIG. 1 is a perspective view of a computer housing wall portion upon which a printed circuit board is operatively mounted using specially designed retention apparatus embodying principles of the present invention.

Perspectively illustrated in FIG. 1 is a bottom wall portion 10 of a molded plastic computer housing 12. Bottom wall portion 10 has a front end edge 14, upstanding left and right side edge portions 16 and 18, and an upstanding rear end edge portion 20. In a conventional manner, the top side of the bottom wall portion 10 is conductively coated to inhibit the downward escape from the computer housing 12, through wall portion 10, of EMI/RFI radiation generated by computer operating components disposed within the computer housing. One of these operating components is the representatively illustrated printed circuit board 22 whose planar body portion 24 is mounted atop the lower housing wall 10 by a specially designed snap-on retention and grounding system 26 embodying principles of the present invention.

Referring now to FIGS. 1, 2 and 4, the snap-on retention and grounding system 26 is, for the most part, molded integrally with the plastic bottom housing wall 10 and includes spaced apart retention stations 26a (see FIG. 4), representatively seven in number, each including an upstanding hook plate 28, an upstanding contact tab 30, and a pair of upstanding rib portions 32 and 34. The system 26 also includes a latch portion 36 secured to the housing wall 10 and resiliently deflectable relative thereto in vertical directions as indicated by the double-ended arrow 38 in FIG. 1.

Each hook plate 28 has, in general, an inverted L-shaped configuration, a forwardly projecting outer end portion 28a, a downturned portion 28b on the front end of portion 28a, and a downwardly and rearwardly tapered bottom end surface 28c disposed on portion 28b, the surface 28c terminating at its rear side in a relatively small, rather sharply radiused contact portion 28d. The contact tab 30 associated with each hook plate 28 is spaced forwardly and downwardly apart from the hook plate front end portion 28b and has a rectangular upper end surface 40. The ribs 32 and 34 extend along opposite sides of the facing hook plate and contact tab pairs 28,30.

In forming the hook plate and contact tab pairs 28,30 (preferably by an injection molding process), a series of small rectangular openings 42 are formed through the bottom housing wall 10, with each opening 42 being positioned between a facing hook plate 28 and contact tab 30 and bounded on its opposite sides by a facing pair of rib portions 32 and 34. As best illustrated in FIG. 4, the members 28,30,32 and 34 in each of the retention stations 26a define therebetween an open-topped tunnel area 42a extending upwardly from the rectangular wall opening 42.

To facilitate the operative attachment and grounding of the printed circuit board 12 to the computer housing wall 10, a spaced series of slots 44, elongated in front-to-rear directions, are formed through the body 24 of the printed circuit board 22 and are configured and positioned to be aligned with and upwardly receive the hook plates 28. The lengths of the slots 44 are longer than the maximum front-to-rear dimensions of the hook plates 28, and the horizontal widths of the slots 44 are slightly greater than the horizontal thicknesses of the hook plates 28. For purposes later described, electrically conductive pads 46,47 are respectively formed on the bottom and top sides of the circuit board body 24 rearwardly adjacent the slots 44.

To very easily and rapidly mount the circuit board 22 atop the bottom computer housing wall 10, without using screws of any sort, the circuit board body 24 is first positioned above the housing wall 10 with the circuit board body slots 44 in alignment with the hook plates 28, and the front end edge 48 of the board body 24 being positioned somewhat forwardly of the latch member 36 (see FIG. 1). Next, the circuit board body 24 is pushed downwardly (as indicated by the arrow 50 in FIG. 1) to cause a front end edge portion of the circuit board body 24 to resiliently depress the latch member 36, the underside of the circuit board body to be brought into contact with the upper ends of the contact tabs 30, and the upper ends 28a of the hook plates 28 to pass upwardly through the circuit board body slots 44 as shown in FIGS. 2 and 3.

Finally, as indicated by the arrow 52 in FIG. 1, the circuit board body 24 is pushed rearwardly until the front edge 48 of the circuit board body 24 rearwardly clears the depressed latch member 36 and permits it to pop back up to its normal, nondeflected position shown in FIG. 1 at which point the latch member prevents forward movement of the circuit board 22 relative to the bottom housing wall 10 until the latch member 36 is depressed again. As the circuit board body 24 is rearwardly moved relative to the bottom housing wall 10, the front end edges 44a of the circuit board body slots 44 (see FIG. 3) contact the sloping end surfaces 28c of the hook plates 28 and cooperate therewith to force the circuit board body 24 under the radiused hook plate end surfaces 28d, thereby firmly pressing the circuit board body against the top ends of the contact tabs 30.

When the circuit board 22 rearwardly reaches its installed position shown in FIGS. 3 and 4, the upper end surfaces 40 of the contact tabs 30 are firmly pressed against the conductive pads 46 on the underside of the circuit board body 24, and the radiused hook plate contact portion 28d to engage the pad 47, thereby creating an EMI/RFI grounding interconnection between the circuit board 22 and the bottom computer housing wall 10. The firmness of this grounding interconnection is desirably enhanced by the use of the relatively small, radiused end portions 28d of the hook plates 28 which serve to exert relatively concentrated, downwardly directed retention loads on spaced apart locations on the circuit board body. These concentrated retention loads prevent upward movement of the circuit board relative to the housing wall 10.

To rapidly remove the mounted circuit board 22, the latch member 36 (FIG. 1) is simply depressed, the circuit board is slid forwardly along the tops of the contact tabs 30 until the front edges 44a of the circuit board body slots 44 are positioned forwardly of their associated top hook plate end portions 28a, and the circuit board body 24 is lifted off the contact tabs 30.

As previously mentioned, this snap-on mounting and EMI/RFI grounding of the circuit board 22 is effected without the conventional use of a series of screws to mount the circuit board. Accordingly, both the installation and subsequent removal of the board are much quicker and easier, and the possibility of dropping mounting screws into the interior of the computer is eliminated.

Referring again to FIG. 4, the integral molding of the retention stations 26a with the bottom housing wall 10 provides for quite economical fabrication of the overall circuit board retention and grounding system 10. As will be readily appreciated by those skilled in the plastic fabrication art, the relative configurations of the hook plates 28 and contact tabs 30 permit each retention station 26a to be fabricated without the use of complex plastic tooling such as slides and lifters.

Additionally, due to the relative positioning and configurations of the components 28,30,32 and 34 of each retention station 26a, coupled with the relatively small sizes of the housing wall openings 42 which they border, the EMI/RFI radiation emitted by the circuit board 22 through each opening 42 is sufficiently attenuated such that the openings 42 need not be plugged or otherwise covered—they may simply be left open. The desirable attenuation of emitted EMI/RFI radiation through the housing wall openings 42 is enhanced by the opposing upstanding rib pairs 32,34 which, with the facing portions of the hook plates 28 and their associated contact tabs 30, define the tunnel areas 42a that extend upwardly from the openings 42.

The foregoing detailed description is to be clearly understood as being given by way of illustration and example only, the spirit and scope of the present invention being limited solely by the appended claims.

What is claimed is:

1. Apparatus for removably securing a printed circuit board to a computer housing wall, said apparatus comprising:
   a spaced series of openings formed through the circuit board;
   a spaced series of retention structures formed on a side of the housing wall and operative to removably hold the circuit board thereon in a parallel relationship therewith, each of said retention structures including:
      first projecting means against which a side of the circuit board may be placed when the circuit board is laterally moved toward said housing wall side to a first parallel position relative thereto, and
      second projecting means extendable through one of said circuit board openings in response to lateral movement of the circuit board to said first position thereof,
         said first and second projecting means functioning to cooperatively and releasably bear against spaced opposite side surface portions of the circuit board, in response to edgewise movement of the circuit board from said first position thereof to a second position, in a manner releasably holding the circuit board in said second position thereof; and
   cooperating means on said retention structures and the circuit board for facilitating an EMI/RFI grounding connection between the circuit board and the housing wall when the circuit board is in said second position thereof.

2. The apparatus of claim 1 wherein said cooperating means include:
   an electrically conductive coating on the housing wall and said retention structures, and
   a spaced series of electrically conductive pad members disposed on a side of the circuit board and positioned to be engaged by said first projecting means when the circuit is in said second position thereof.

3. Apparatus for removably securing a printed circuit board to a computer housing wall, said apparatus comprising:
   a spaced series of openings formed through the circuit board;
   a spaced series of retention structures formed on a side of the housing wall and operative to removably hold the circuit board thereon in a parallel relationship therewith, each of said retention structures including:
      first projecting means against which a side of the circuit board may be placed when the circuit board is laterally moved toward said housing wall side to a first parallel position relative thereto, and
      second projecting means extendable through one of said circuit board openings in response to lateral movement of the circuit board to said first position thereof,
         said first and second projecting means functioning to cooperatively and releasably bear against spaced opposite side surface portions of the circuit board, in response to edgewise movement of the circuit board from said first position thereof to a second position, in a manner releasably holding the circuit board in said second position thereof,
   each of said retention structures having an opening positioned between its first and second projecting means and extending through the housing wall, and further including projecting rib means formed on the housing wall and defining with the first and second projecting means a tunnel area communicating with the housing wall opening and serving to reduce EMI/RFI emissions from the secured circuit board outwardly through the housing wall opening.

4. A screwless method of removably mounting a printed circuit board on the inner side of a computer housing wall, said method comprising the steps of:
   forming a spaced series of openings in the circuit board, each of said openings extending between first and second opposite sides of the circuit board;
   forming a spaced series of retention structures on the inner side of the housing wall, each of said retention structures including spaced apart first and second portions projecting inwardly beyond the inner housing wall side;
   laterally moving the circuit board, first side first, toward the inner housing wall side to a first position in which the first side of the circuit board engages said first retention structure portions, and said second retention structure portions extend through the circuit board openings past the second circuit board side;
   moving the circuit board edgewise from said first position thereof to a second position in which the circuit board is frictionally and releasably gripped, on its opposite first and second sides, between said first and second portions of said retention structures;

conductively coating said first retention structure portions; and forming a spaced apart series of electrically conductive pad areas disposed on the first side of the circuit board and positioned to be forcibly engaged by said first retention structure portions when the circuit board is in said second position thereof.

5. Computer apparatus comprising:

a computer housing having a generally flat wall with an inner side;

a spaced series of retention structures carried on said inner side of said housing wall, each of said retention structures including:

a hook plate member having a body portion extending generally transversely to said housing wall, and an outer end portion extending from said body portion generally parallel to said housing wall in a first direction, said outer end portion having a free end section extending toward said housing wall and terminating in a contact surface area, and a contact tab member extending generally transversely to said housing wall and having an outer end surface spaced apart from said hook plate member contact surface area in said first direction and being offset from said contact surface area toward said housing wall, said retention structures and said inner side of said housing wall being coated with an electrically conductive material;

a printed circuit board removably mounted on said retention structures, in a parallel relationship with said housing wall, said printed circuit board having a spaced series of slots formed therein and elongated in said first direction, said printed circuit board having a first side forcibly and slidably engaging said outer end surfaces of said contact tab members, and said hook plate members being removably extended through said slots with said outer end portions of said hook plate members overlying the second side of said printed circuit board and said contact surface areas of said hook plate members forcibly and slidably engaging said second side of said printed circuit board; and electrically conductive contact pads carried on said first side of said printed circuit board and slidably engaged by said outer end surfaces of said contact tab members.

6. The computer apparatus of claim 5 wherein:

each of said contact surface areas has a relatively small, radiused shape and forcibly engages said second side of said printed circuit board in a concentrated point loading manner.

7. The computer apparatus of claim 5 wherein:

said printed circuit board is removable from said retention structures by sliding said printed circuit board in said first direction to position said hook plate member outer end portions over said slots and thereby permit the printed circuit board to be moved away from said housing wall as said hook plate member outer end portions pass through said slots.

8. Computer apparatus comprising:

a computer housing having a generally flat wall with an inner side;

a spaced series of retention structures carried on said inner side of said housing wall, each of said retention structures including:

a hook plate member having a body portion extending generally transversely to said housing wall, and an outer end portion extending from said body portion generally parallel to said housing wall in a first direction, said outer end portion having a free end section extending toward said housing wall and terminating in a contact surface area, and a contact tab member extending generally transversely to said housing wall and having an outer end surface spaced apart from said hook plate member contact surface area in said first direction and being offset from said contact surface area toward said housing wall; and a printed circuit board removably mounted on said retention structures, in a parallel relationship with said housing wall, said printed circuit board having a spaced series of slots formed therein and elongated in said first direction, said printed circuit board having a first side forcibly and slidably engaging said outer end surfaces of said contact tab members, and said hook plate members being removably extended through said slots with said outer end portions of said hook plate members overlying the second side of said printed circuit board and said contact surface areas of said hook plate members forcibly and slidably engaging said second side of said printed circuit board, said housing wall, at each of said retention structures, having an opening formed therein between the hook plate and contact tab portions of the retention structure, and said computer apparatus, at each of said retention structures, further comprises a pair of upstanding ribs formed on the inner side of said housing wall and forming with the hook plate and contact tab portions of the retention structure a tunneled extension of the wall opening to thereby inhibit EMI/RFI radiation emission from said printed circuit board outwardly through said housing wall opening.

* * * * *